United States Patent [19]

Lind et al.

[11] 4,035,743

[45] July 12, 1977

[54] RADIO FREQUENCY OSCILLATOR

[75] Inventors: James N. Lind; Sherwood A. McOwen, Jr.; Toshikazu Tsukii, all of Santa Barbara, Calif.

[73] Assignee: Raytheon Company, Lexington, Mass.

[21] Appl. No.: 708,244

[22] Filed: July 23, 1976

[51] Int. Cl.² .......................................... H03B 7/14
[52] U.S. Cl. ............................ 331/101; 331/177 V
[58] Field of Search ............... 331/101, 96, 107 R, 331/107 G, 177 V; 332/30 V; 330/56

[56] References Cited

U.S. PATENT DOCUMENTS

| | | | |
|---|---|---|---|
| 3,443,247 | 5/1969 | Fjerstad | 331/177 V |
| 3,688,219 | 8/1972 | Havens | 331/96 |
| 3,714,605 | 1/1973 | Grace et al. | 331/96 |
| 3,735,286 | 5/1973 | Vane | 331/101 |
| 3,982,211 | 9/1976 | Endersz | 331/177 V |

*Primary Examiner*—John Kominski

*Attorney, Agent, or Firm*—Richard M. Sharkansky; Philip J. McFarland; Joseph D. Pannone

[57] ABSTRACT

A radio frequency oscillator having an improved varactor mounting structure and tuning slug mounting arrangement is disclosed. The varactor mounting structure includes a coaxial transmission line, one end of the center conductor thereof being capacitively coupled to the cavity of the oscillator and the other end being coupled to the varactor. The length of the center conductor is λ/2 where λ is the nominal operating wavelength of the oscillator and hence, while disposed outside the cavity, such varactor appears, electrically, within the cavity. A feed wire for coupling a direct current control signal to the varactor is connected between the housing of the oscillator and the center conductor at a point λ/4 from the capacitively coupled end of the center conductor. Therefore, while such wire enables direct current to pass between the housing and the varactor, such wire is electrically isolated from the radio frequency energy in the cavity. The tuning slug mounting arrangement secures the entire periphery of tuning slugs securely within the housing.

4 Claims, 5 Drawing Figures

RADIO FREQUENCY OSCILLATOR

BACKGROUND OF THE INVENTION

This invention relates generally to radio frequency (RF) oscillators and more particularly to RF oscillators which include voltage controlled variable capacitance devices for electronically tuning such oscillators.

As is known in the art, one type of RF oscillator includes a coaxial transmission line cavity having a negative resistance diode, such as an IMPATT diode, disposed at one end thereof and a load coupled to the other end thereof. A voltage controlled variable capacitance device, commonly referred to as a varactor, is capacitively coupled to the center conductor of the coaxial transmission line cavity to electrically vary the capacitance of such cavity and thereby electrically tune such cavity. Also included may be tuning stubs mounted about the center conductor and disposed between the negative resistance diode and the load to provide frequency tuning and impedance matching between the negative resistance diode and the load. In one such oscillator, the slugs are movable along the longitudinal axis of the coaxial transmission line and are so moved until the proper frequency and impedance matching are obtained. Then such slugs are locked into position. One locking technique used for this purpose is to provide each tuning slug with a screw which passes through a slot in the wall of the outer conductor of the coaxial transmission line into a hole tapped into the side of the tuning slug. When the screw is in a loosened condition, the slug is free to slide and, when the desired position is obtained, the screw is tightened thereby securing the slug in position relative to the outer conductor. While such technique may be satisfactory in some applications, in other applications as where the oscillator may experience high levels of mechanical vibration and shock the screws tend to loosen and the position of the slug thereby changes with the result that the negative resistance diode and the load are no longer impedance matched.

Further, when the RF oscillator is to be used in such a high mechanical vibration, high shock environment, it is necessary that the varactor also be securely mounted within the cavity. Further, the varactor must be mounted so that not only will it be able to withstand high levels of mechanical shock and vibration, but also so that proper direct current control signals may be applied to it with maximum isolation between the RF energy within the cavity and such control signals.

SUMMARY OF THE INVENTION

With this background of the invention in mind, it is therefore an object of this invention to provide an improved RF oscillator having an electrically controlled variable capacitance device mounting structure which enables such device to be securely mounted to the oscillator.

It is another object of this invention to provide an improved RF oscillator having an electrically controlled variable capacitance device mounting structure which enables such device to be securely fastened to the oscillator and which provides improved electrical isolation between RF energy in the oscillator and direct current control signals used to control the device.

It is also an object of this invention to provide an RF oscillator having an improved tuning slug mounting arrangement.

These and other objects of the invention are attained generally by providing, in a radio frequency oscillator having an inner conductor surrounded by an outer conductor, an improved varactor mounting structure comprising: a hollow, conductive housing mounted to the outer conductor; a conductive rod disposed within the hollow conductive housing to form a transmission line, a first end of such conductive rod being disposed adjacent a portion of the inner conductor, such adjacent portion of the inner conductor and such end of the conductive rod forming a coupling capacitor; a varactor having one electrode thereof mounted to the second end of such conductive rod, such transmission line serially connecting the varactor and the coupling capacitor, the length of the conductive rod between the electrode of the varactor and the first end of such rod being $\lambda/2$ where $\lambda$ is the nominal operating wavelength of the oscillator; and a conductive wire connected between the housing and the conductive rod, such wire being coupled to such rod at a point $\lambda/4$ from the first end of such rod.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENT

Figure 1:
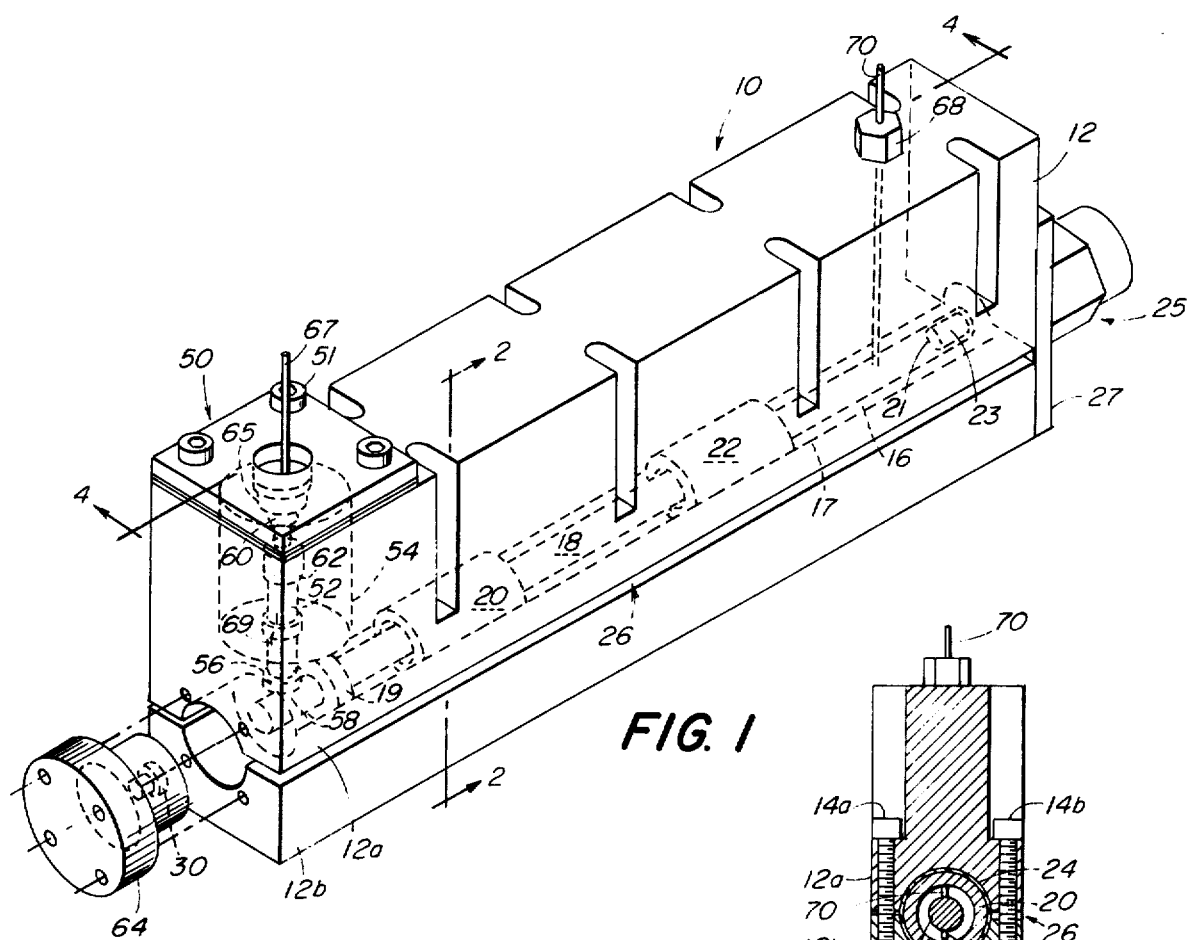
FIG. 1 is an isometric view, partially exploded, of a radio frequency oscillator according to the invention.
Figure 2:
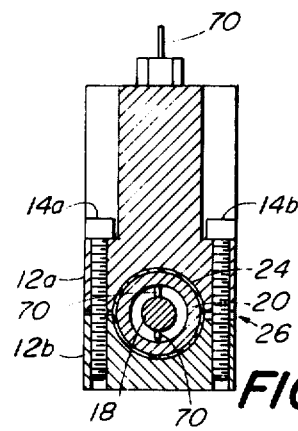
FIG. 2 is a cross-sectional view of the radio frequency oscillator shown in FIG. 1 taken along line 2—2 in FIG. 1.
Figure 4:
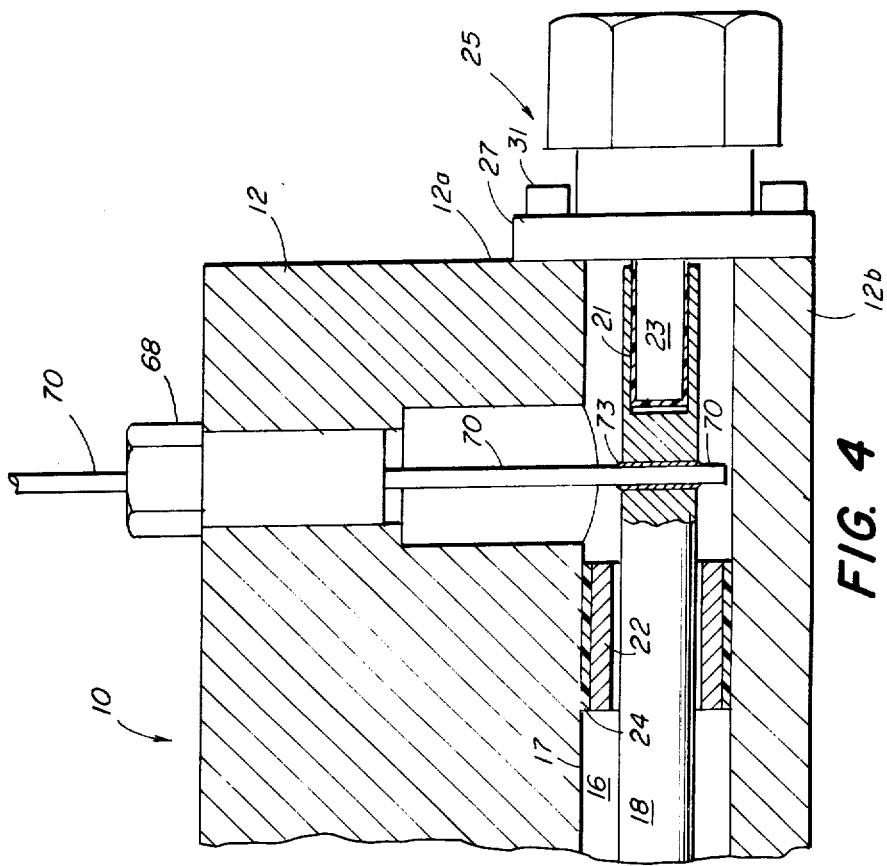
FIG. 4 is a cross-sectional view of the radio frequency oscillator shown in FIG. 1 taken along line 4—4 in FIG. 1.
Figure 4:
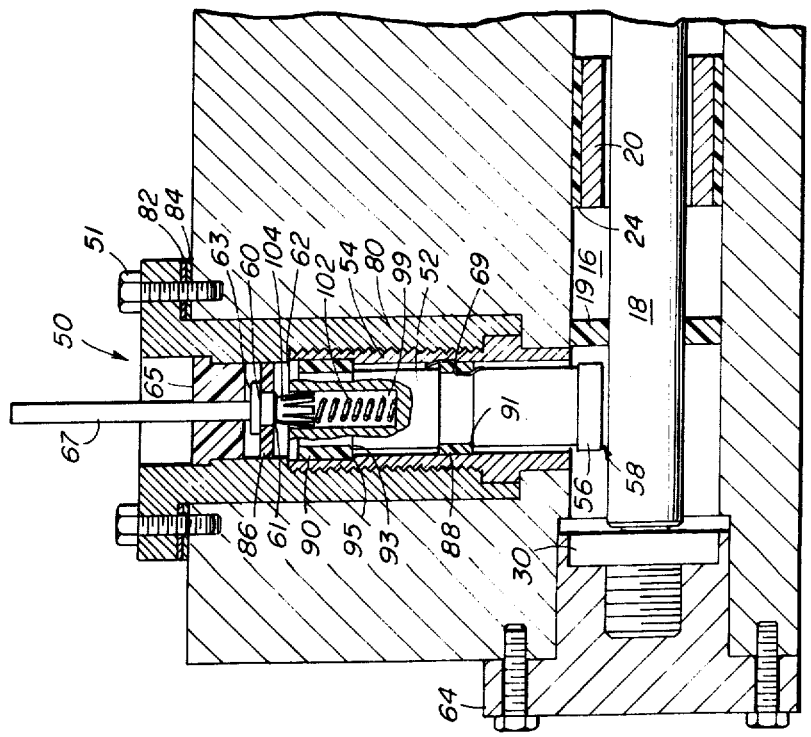

Referring now to FIGS. 1 and 4, a radio frequency (RF) oscillator 10 is shown to include an elongated housing 12. Such housing is made up of an upper section 12a and a lower section 12b. The upper and lower sections 12a, 12b are affixed together by eight mounting screws, only mounting screws $14_a$, $14_b$ being shown in FIG. 2. When so affixed, a hollow cylinder 16 is formed within the housing 12 along the longitudinal axis thereof. The outer walls of such formed hollow cylinder 16 provide an outer conductor 17 which surrounds an inner conductor 18 to form a coaxial transmission line. The inner conductor 18 is positioned centrally within the hollow cylinder 16 by a dielectric disk 19 and a dielectric sleeve 21 which is mounted about the extreme portion of the center conductor 23 of a coaxial connector 25. The dielectric sleeve 21 prevents any direct current on the inner conductor 18 from passing to the center conductor 23 of coaxial connector 25. The dielectric sleeve 21 and the portion of the center conductor 23 covered by such sleeve are fitted into cylindrical recess formed within the inner conductor 18 along such a conductor's longitudinal axis. The coaxial connector 25 has its outer conductor electrically connected to the housing 12 by a mounting plate 27, such plate 27 being held on to the housing 12 by conventional screws 31 (FIG. 4).

A pair of toroidally shaped conductive tuning slugs 20, 22 is positioned about the inner conductor 18. A dielectric material 24 is fastened here by a suitable epoxy (not shown) about the outer periphery of such tuning slugs, as shown also in FIG. 2. The inner diameter of the tuning slugs 20, 22 is larger than the diameter of the inner conductor 18. When the upper and lower sections 12a, 12b of the housing 12 are fastened together tightly by the eight mounting screws (as described above) the outer walls of the hollow cylinder 16 formed in such housing 12 secure the tuning slugs into a position fixed with respect to the housing 12. When the upper and lower sections 12a, 12b are only loosely affixed (as by loosening the eight mounting screws) the tuning slugs 20, 22 may be slid along the longitudinal axis of the housing 12 by inserting a thin knife-like tool (not shown) through a slot 26 (as is shown also in FIG. 2) formed between one side of the upper and lower sections 12a, 12b. As will become apparent, this enables the RF oscillator 10 to be mechanically tuned. More specifically, such arrangement enables the tuning slugs 20, 22 to be positioned within the housing 12 in a way which provides impedance matching between a negative resistance diode, here IMPATT diode 30, and a load (not shown but which is connected to the RF oscillator 10 via the coaxial connector 25). When so properly positioned, the eight mounting screws (i.e. only screws 14a, 14b being shown in FIG. 2) are tightened to rigidly secure the tuning slugs into such proper position.

A varactor mounting structure 50 is mounted within the housing 12. Such mounting structure 50 is fastened by screws 51 (FIG. 4) and includes a conductive rod 52 disposed within a hollow cylindrical shaped conductive housing 54 to form a transmission line. One end 56 of such rod protrudes through the housing 54 and is positioned adjacent a portion of the inner conductor 18. The adjacent portion of the inner conductor and such end 56 of the rod 52 form a coupling capacitor 58. A varactor 60 has one electrode 61 mounted to the other end 62 of such conductive rod 52 (FIG. 4). The other electrode 63 is connected to a lead 67 which passes through a feed through capacitor 65 to a suitable variable D.C. voltage supply (not shown). A mounting plate 64 holds the IMPATT diode 30 to that one electrode of such diode 30 is electrically connected to such mounting plate 64 and the other electrode of such diode 30 is secured against the inner conductor 18 when such plate is fastened to the housing 12 by conventional screws (FIG. 4). A conductive wire 69 is connected between the housing 54 and the conductive rod 52. The wire 69 thereby connects the electrode 61 to the housing 54. Therefore, the variable D.C. voltage supply (not shown) having one terminal connected to lead 67 and the other terminal connected to the housing 54 thereby provides a D.C. control signal for the varactor 60.

A wire 70 passes through a feed through capacitor 68 into a small hole formed in the inner conductor 18. The diameter of the wire 70 and the diameter of the hole are such that when such wire 70 is inserted into such hole, there is, after solder 73 affixes the wire 70 to the inner conductor 18 when the upper and lower sections 12a, 12b are separated, an electrical connection between the wire 70 and the inner conductor 18. The wire 70 is connected to one terminal of a suitable D.C. voltage supply (not shown), the other terminal of such D.C. supply being connected to the housing 12 by conventional means (not shown). This D.C. supply thus supplies energy to the IMPATT diode 30 and dielectric sleeve 21 prevents any D.C. current on the inner conductor 18 from passing to the center conductor 23 of coaxial connector 25 as described above.

Figure 3:
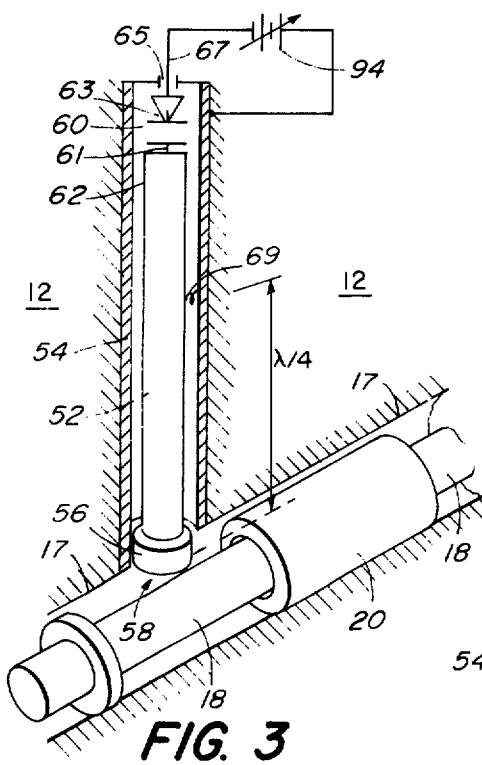
FIG. 3 is a diagrammatical sketch of a portion of the radio frequency oscillator shown in FIG. 1.

Referring now to FIG. 3, a diagrammatical sketch shows a portion of the RF oscillator. Such oscillator includes: a coaxial transmission line having the outer conductor 17 formed by the outer walls of a hollow cylinder formed in housing 12; the inner conductor 18; and one of the tuning slugs, here tuning slug 20, disposed adjacent to the inner conductor 18. Also shown is the cylindrical conductive housing 54, connected to the housing 12, having the conductive rod 52 disposed therein to form a transmission line. The end 56 of such rod 52 protrudes from the conductive housing 54 to form the coupling capacitor 58. The electrode 61 of the varactor 60 is electrically connected to end 62 of the rod 52. The electrode 63 of such varactor 60 is connected to the lead 67, such lead 67 passing through the feed-through capacitor 65. The wire λ/is used to connect the conductive rod 52 to the housing 54. The length of the rod 52 is 2 where λ is the nominal operating wavelength of the RF oscillator 10. In this way the varactor 60 appears electrically at the end 56 of the rod 52. Further, the wire 69 is disposed between the rod 52 and the housing 54 at a point λ/4 from the end 56 of rod 52. In this way, while such wire 69 provides a D.C. path for the varactor 60 D.C. control signal (i.e. for D.C. current supplied by the variable D.C. voltage supply 94 shown in FIG. 3), such wire 69 is electrically isolated from radio frequency energy within the RF oscillator 10.

Referring again to FIG. 4, and more specifically to the varactor mounting structure 50, it is noted that such structure 50 includes a cylindrical bushing 80 fastened to housing 12 by screws 51. Shims 82, 84 are included to control the depth that such bushing 80 is inserted into such housing 12. The conductive housing 54 of such varactor mounting structure 50 is secured to bushing 80 by threads, as indicated. The feed-through capacitor 65 is epoxyed to the bushing 80. The varactor diode 60 is positioned centrally within the hollow conductive housing 54 by a dielectric toroidal shaped disk 86. The conductive rod 52 is positioned centrally within the conductive housing 54 by a pair of resilient dielectric spacers 88, 90. Such spacers 88, 90 are each formed in two semicircular pieces and the inner portions of such pieces are positioned in circular grooves 91, 93 respectively formed about the circumference of the conductive rod 52. The outer periphery of spacer 90 snaps into a groove 95 formed within the housing 54 when the grooves 93, 95 are properly aligned, thereby enabling the spacer 90 to secure the rod 52 properly positioned within the housing 54.

Figure 5:
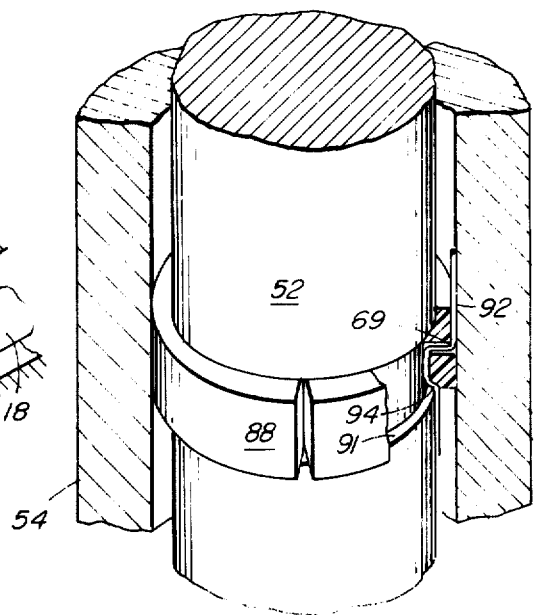
FIG. 5 is an isometric view, partially cut away, of a portion of the radio frequency oscillator shown in FIG. 1.

Spacer 88 has a small hole formed through it (FIG. 5) to enable conductive wire 69 to pass through it. The length of the wire 69 is substantially greater than the cross-section of the spacer 90 and therefore one end 92 of wire 69 is firmly held against (and hence electrically conducted to) housing 54 and the other end 94 of wire 69 is firmly held against (and hence electrically connected to) conductive rod 52. The spacer 88 is, as described above, held into a fixed position on the rod 52 by the circular groove 91. The groove 91 is separated from end 56 of rod 52 a distance λ/4 and therefore the wire 69 is also firmly positioned from end 56 a distance λ/4 as discussed in connection with FIG. 3.

Referring again to FIG. 4, end 62 of rod 52 has a hollow cylindrical recess 99 formed along the longitudinal axis thereof. Inserted into such recess 99 is a coil spring 102 which engages an open end of a conductive cup-shaped element 104, as shown. The base of such element 104 is in electrical and mechanical contact with electrode 61 of varactor diode 60. The wire 67 is fixed within the feed-through capacitor 65. Therefore, the spring-loaded cup ensures good electrical and mechanical contact between end 62 of rod 52 and the varactor 60.

With such arrangement the varactor 60 is rigidly supported within the RF oscillator 10 and such oscillator is thereby operable in a relatively high vibrational environment.

Having described a preferred embodiment of this invention, it is now evident that other embodiments incorporating these concepts may be used. It is felt, therefore, that this invention should not be restricted to the disclosed embodiment but rather should be limited only by the spirit and scope of the appended claims.

What is claimed is:

1. In a radio frequency oscillator having an inner conductor surrounded by an outer conductor, an improved varactor mounting structure comprising: a hollow conductive housing mounted to the outer conductor; a conductive rod disposed within the hollow conductive housing to form a transmission line, a first end of such conductive rod being disposed adjacent a portion of the inner conductor, such adjacent portion of the inner conductor and such end of the conductive rod forming a coupling capacitor; a varactor having one electrode thereof mounted to the second end of such conductive rod, such transmission line serially connecting the varactor and the coupling capacitor, the length of the conductive rod between the electrode of the varactor and the first end of such rod being λ/2 where λ is the nominal operating wavelength of the oscillator; and a conductive wire connected between the housing and the conductive rod, such wire being coupled to such rod at a point λ/4 from the first end of such rod.

2. The varactor mounting structure recited in claim 1 including a negative resistance diode having one electrode coupled to the inner conductor and a second electrode connected to the outer conductor and including a tuning slug disposed about the inner conductor, the coupling capacitor being disposed between the negative resistance diode and the tuning slug.

3. The varactor mounting structure recited in claim 2 including a dielectric spacer disposed about the conductive rod to position such rod within the hollow conductive housing and wherein such conductive wire passes through such spacer between the housing and the conductive rod.

4. In the radio frequency oscillator as recited in claim 1 a tuning slug arrangement comprising at least one hollow tuning slug disposed around the inner conductor, such tuning slug having a dielectric material disposed about the periphery thereof, such outer conductor being fastened to the dielectric material to secure such tuning slug to such outer conductor.

* * * * *